(12) United States Patent
Tsukagoshi et al.

(10) Patent No.: US 7,483,191 B2
(45) Date of Patent: Jan. 27, 2009

(54) HOLOGRAPHIC RECORDING METHOD, HOLOGRAPHIC MEMORY REPRODUCTION METHOD, HOLOGRAPHIC RECORDING APPARATUS, AND HOLOGRAPHIC MEMORY REPRODUCTION APPARATUS

(75) Inventors: Takuya Tsukagoshi, Sagamihara (JP); Jiro Yoshinari, Tokyo (JP); Hideaki Miura, Tokyo (JP); Tetsuro Mizushima, Moriguchi (JP)

(73) Assignee: TDK Corporation, Tokyo (JP)

( * ) Notice: Subject to any disclaimer, the term of this patent is extended or adjusted under 35 U.S.C. 154(b) by 241 days.

(21) Appl. No.: 10/583,405

(22) PCT Filed: Dec. 6, 2004

(86) PCT No.: PCT/JP2004/018166

§ 371 (c)(1),
(2), (4) Date: Jun. 20, 2006

(87) PCT Pub. No.: WO2005/066876

PCT Pub. Date: Jul. 21, 2005

(65) Prior Publication Data

US 2007/0121185 A1    May 31, 2007

(30) Foreign Application Priority Data

Dec. 26, 2003    (JP)    ............................. 2003-434406

(51) Int. Cl.
G02B 5/32    (2006.01)
(52) U.S. Cl. ....................................... 359/21; 345/698

(58) Field of Classification Search ................... 359/1, 359/21, 22, 32; 345/694, 696, 698
See application file for complete search history.

(56) References Cited

U.S. PATENT DOCUMENTS

| | | | | |
|---|---|---|---|---|
| 6,549,664 | B1 * | 4/2003 | Daiber et al. | ............... 382/232 |
| 2003/0128324 | A1 * | 7/2003 | Woods et al. | ............... 349/143 |

FOREIGN PATENT DOCUMENTS

| | | |
|---|---|---|
| JP | A 8-202796 | 8/1996 |
| JP | A 2001-126267 | 5/2001 |

OTHER PUBLICATIONS

Heanue et al., "Volume Holographic Storage and Retrieval of Digital Data," Science, vol. 265, pp. 749-752, Aug. 5, 1994.
Marcus, "Modulation Codes for Holographic Recording," Holographic Data Storage, Springer Verlag, pp. 283-291, 2000.

* cited by examiner

*Primary Examiner*—Alessandro Amari
(74) *Attorney, Agent, or Firm*—Oliff & Berridge, PLC

(57) ABSTRACT

A holographic recording and reproduction apparatus has a spatial light modulator for converting digital information to a two-dimensional image and for intensity modulating an object beam based on the two-dimensional image. The spatial light modulator is configured to employ four or more pixels on the two-dimensional image as a unit pixel block, and allow at least two types of encoded patterns having a different number of ON pixels in the unit pixel block to be present at the same time for display of the two-dimensional image. During a reproduction operation, a two-dimensional photodetector detects the amount of light on per unit pixel block basis to determine the number of its ON pixels and then set a threshold, and thereafter an image pickup device detects the image.

6 Claims, 6 Drawing Sheets

(A)

(B)

(C)

☐ = ON pixel
▨ = OFF pixel (A)

(B)

(C)

US 7,483,191 B2

HOLOGRAPHIC RECORDING METHOD, HOLOGRAPHIC MEMORY REPRODUCTION METHOD, HOLOGRAPHIC RECORDING APPARATUS, AND HOLOGRAPHIC MEMORY REPRODUCTION APPARATUS

TECHNICAL FIELD

This invention relates to a holographic recording method and apparatus for directing an object beam and a reference beam to a holographic recording medium to record information thereon using their interference fringes, and also relates to a holographic memory reproduction method and apparatus for reproducing holographic information recorded.

BACKGROUND ART

There is a holographic recording method and apparatus for recording two-dimensional images, in which digital information is converted to a two-dimensional image and an object beam having been subjected to spatial optical modulation based on the two-dimensional image information is directed to a holographic recording medium in conjunction with a reference beam, thereby recording the two-dimensional image using their interference fringes.

In this case, one pixel in a spatial light modulator used for spatial optical modulation can be associated with one bit of data. However, there is a differential encoding method for associating two pixels in the spatial light modulator with one bit of data (e.g., refer to Science 265,749 (1994) by J. F. Heanue et al.).

This is intended to prevent a bit error rate (BER) from increasing due to crosstalk from neighboring places during a reproduction operation. However, this raises a problem that the image display capability of the spatial light modulator, the image transfer capability of the optical system, and the capability of reading images on a holographic recording medium are limited, unavoidably causing crosstalk to occur between pixels.

In general, when one pixel is employed to represent one bit, the amount of light of a pixel to be detected varies thereby causing an error depending on which is greater, the number of ON pixels or the number of OFF pixels, among eight pixels that include neighboring four pixels or four pixels sharing only the apexes of the pixel.

Accordingly, an error will occur if an OFF pixel having the maximum amount of detected light cannot be distinguished from an ON pixel having the minimum amount among a few ten thousands to a few millions of pixels.

On the other hand, since a predetermined pair of two pixels is coded to either ON/OFF (data of 0) or OFF/ON (data of 1) using the differential encoding method, only such a pixel as having a larger amount of light has to be detected as being ON. That is, no error will occur if the amounts of light of only two pixels are properly identified by comparison.

An encoding method has been suggested which is further improved from the differential encoding method so as to employ a larger number of pixels as a unit (pixel block) to determine a particular number of the pixels as being ON (see B. Marcus, "Modulation Codes for Holographic Recording" in Hans Coufal et al. "Holographic Data Strage," Springer Verlag (2000) p.283).

For example, when with six pixels defined as one block, three of the pixels are coded as being ON and the other three pixels as being OFF, the pixel patterns that can be represented by one pixel block is $_6C_3=20$, that is, four bits can be represented by six pixels.

With the ratio of the number of bits to the number of pixels being defined as the "coding rate," the recording density is proportional to the coding rate. The differential encoding method provides a coding rate of 50%, whereas the coding with six pixels defined as one block provides a coding rate of 67%.

As such, the larger the number of pixels forming one block, the higher the coding rate becomes. However, a coding rate of 100% will never be reached (in the case of non-differential encoding) so long as the number of ON pixels within a pixel block is constant. Furthermore, from the viewpoint of reducing the consumption of the dynamic range of a recording material, the number of ON pixels within a pixel block is desirably as small as possible, and the coding rate tends to be more reduced as the ratio of the number of ON pixels to the number of pixels constituting the block (the ON pixel ratio) becomes farther apart from 50%.

As such, since an encoded pattern with a larger number of ON pixels exhibits a higher degree of photosensitivity consumption per bit, it is possible to constitute the pattern only by a combination of a less number of ON pixels when the system performance is governed by the dynamic range of a recording material. For example, when with nine pixels defined as one pixel block, zero to four ON pixels are allowed in their coding, the number of patterns that can be represented by one pixel block is 256, resulting in a coding rate of 8/9=89%, which is advantageous in the case of the number of ON pixels being fixed.

As described above, an increase in recording capacity causes a problem with the accuracy for image detection during a read operation.

This is because unlike the case of the number of ON pixels being fixed, the simultaneous presence of encoded patterns having different ON pixel ratios may cause variations in the intensity of reproduced images on the image pickup device, leading to a problem that BER increases due to crosstalk between pixels.

DISCLOSURE OF THE INVENTION

The present invention was developed in view of the aforementioned conventional problems. It is therefore an object of the present invention to provide a holographic recording method, a holographic memory reproduction method, a holographic recording apparatus, and a holographic memory reproduction apparatus which allow an increase in coding rate without variations in the intensity of reproduced images even in the simultaneous presence of pixel blocks having a different number of ON pixels.

The inventor has found, as a result of intensive studies, that it is possible to reduce variations in the intensity of reproduced images by employing four or more pixels as a unit pixel block, detecting the number of ON pixels on per unit pixel block basis, and varying the threshold of a detected beam intensity between ON and OFF in a two-dimensional photo detector based on the detected value.

In summary, the above-described objectives are achieved by the following embodiments of the present invention.

(1) A holographic recording method for converting digital information to a two-dimensional image, allowing an object beam to be subjected to spatial optical modulation based on the two-dimensional image, and irradiating a holographic recording medium with the object beam in conjunction with a reference beam to record the two-dimensional image using interference fringes, wherein with four or more pixels on the two-dimensional image employed as a unit pixel block, encoded patterns having a different number of ON pixels are allowed to be present at the same time in the unit pixel block to record the two-dimensional image.

(2) The holographic recording method according to (1), wherein when the number of pixels forming the unit pixel block is n, the number of the encoded patterns is a total sum of $_nC_0$ to $_nC_n$.

(3) A holographic memory reproduction method for reproducing digital information, the digital information being recorded by converting the digital information to a two-dimensional image, and irradiating a holographic recording medium with an object beam having been subjected to spatial optical modulation based on the two-dimensional image, in conjunction with a reference beam to record the two-dimensional image using interference fringes, wherein the two-dimensional image is recorded, with four or more pixels employed as a unit pixel block and at least two types of encoded patterns having a different number of ON pixels in the unit pixel block being allowed to be present at the same time, and during a reproduction operation, the number of ON pixels is detected on the per unit pixel block basis, and a threshold of a detected beam intensity between ON and OFF in a two-dimensional image detector used for image detection is set based on the number of ON pixels detected.

(4) The holographic memory reproduction method according to (3), wherein when the number of pixels in the unit pixel block is n, the number of types of the encoded patterns provided is equal to a total sum N of $_nC_0$ to $_nC_n$, and n types of settings are provided for the threshold of the detected beam intensity.

(5) A holographic recording apparatus for converting digital information to a two-dimensional image, allowing an object beam to be intensity modulated using a spatial light modulator based on the two-dimensional image, and irradiating a holographic recording medium with the object beam in conjunction with a reference beam to record the two-dimensional image using interference fringes, wherein the spatial light modulator is configured to display a two-dimensional image, with four or more pixels on the two-dimensional image employed as a unit pixel block and with at least two types of encoded patterns having a different number of ON pixels in the unit pixel block being allowed to be present at the same time.

(6) The holographic recording apparatus according to (5), wherein when the number of pixels in the unit pixel block is n, the spatial light modulator is configured to display encoded patterns of types equal in number to a total sum N of $_nC_0$ to $_nC_n$.

(7) A holographic memory reproduction apparatus for reproducing digital information by a two-dimensional photo detector used for image detection, the digital information being recorded by converting the digital information to a two-dimensional image, and irradiating a holographic recording medium with an object beam having been subjected to spatial optical modulation based on the two-dimensional image, in conjunction with a reference beam to record the two-dimensional image using interference fringes, wherein the two-dimensional image is recorded, with four or more pixels employed as a unit pixel block and with at least two types of encoded patterns having a different number of ON pixels in the unit pixel block being allowed to be present at the same time, and the holographic memory reproduction apparatus has an ON pixel number detector for detecting the number of ON pixels on the per unit pixel block basis, and a threshold setter for setting a threshold of a detected beam intensity between ON and OFF in the two-dimensional photo detector based on the number of ON pixels detected by the ON pixel number detector.

(8) The holographic memory reproduction apparatus according to (7), wherein when the number of pixels in the unit pixel block is n, the number of types of encoded patterns displayed by the spatial light modulator is set to be equal to a total sum N of $_nC_0$ to $_nC_n$, and the threshold setter is allowed to provide n types of settings for the threshold.

BEST MODE FOR CARRYING OUT THE INVENTION

A holographic recording method according to the present invention is adapted to convert digital information to a two-dimensional image and employ four or more pixels on the two-dimensional image as a unit pixel block, allowing digital information to be recorded in the simultaneous presence of encoded patterns having a different number of ON pixels in the unit pixel block. During a reproduction operation, the method allows for detecting the number of ON pixels on per unit pixel block basis, and based on the number of ON pixels detected, setting on per pixel block basis the threshold of a detected beam intensity between ON and OFF in a two-dimensional photo detector used for image detection, thereby achieving the aforementioned object.

First Embodiment

Figure 1:
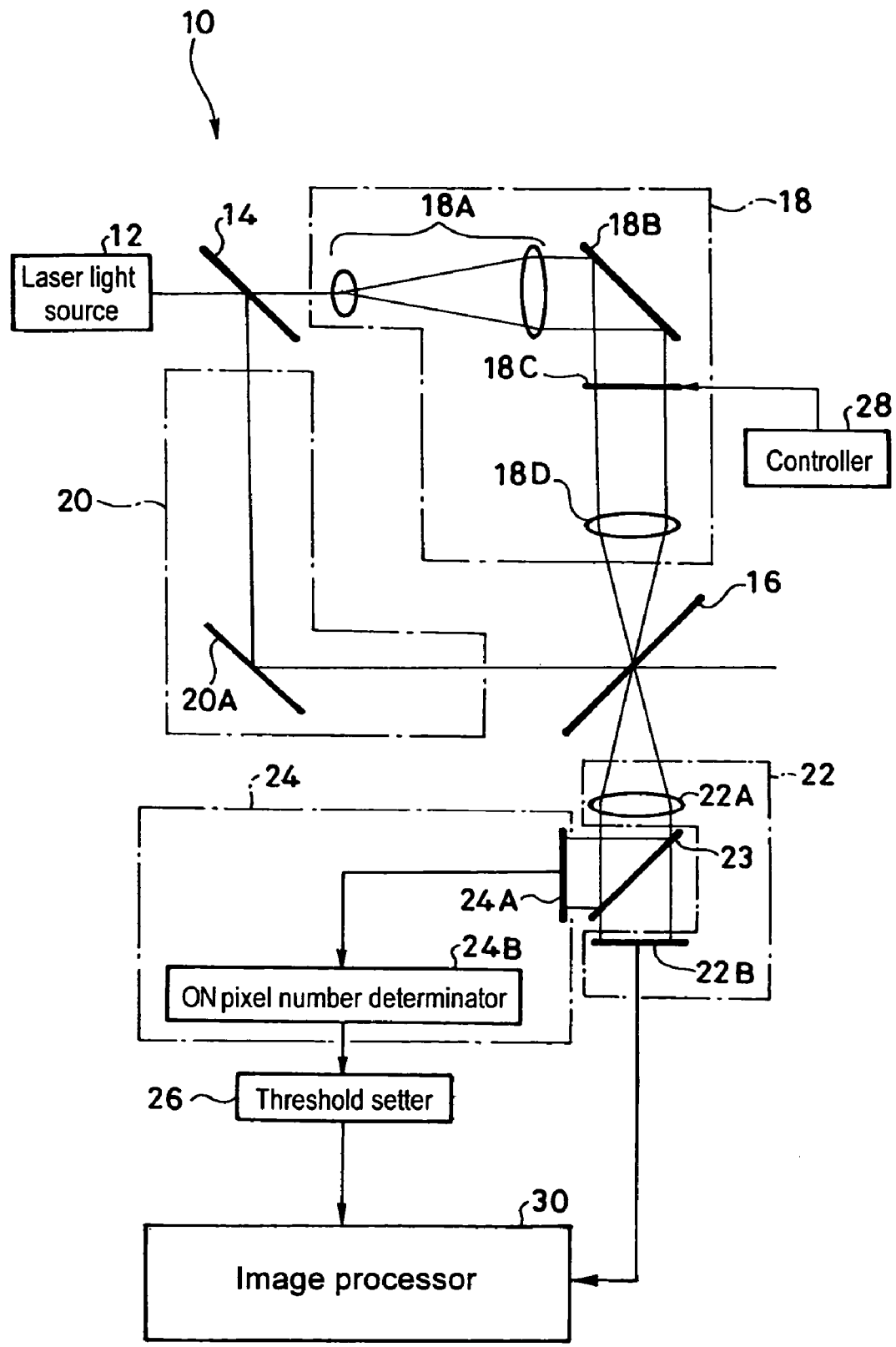
FIG. 1 is a diagram illustrating an optical system of a holographic recording and reproducing apparatus according to a first embodiment of the present invention.

Now, referring to FIG. 1, a description will be given to a first embodiment of the present invention.

A holographic read and write apparatus 10 according to the first embodiment is configured to include: a laser light source 12; a beam splitter 14 for transmitting and reflecting a laser beam emitted from the laser light source 12 to thereby split into a reference beam and an object beam; an object optical system 18 for directing an object beam having passed through the beam splitter 14 to a holographic recording medium 16; a reference optical system 20 for directing a reference beam reflected off the beam splitter 14 to the holographic recording medium 16; an image pickup optical system 22 for reproducing two-dimensional information from a diffracted beam that is produced when the holographic recording medium 16 is radiated with a reproduction beam; an ON pixel number detector 24; and a threshold setter 26.

The object optical system 18 is configured to include a beam expander 18A for increasing the beam diameter of the object beam having passed through the beam splitter 14, a mirror 18B, a spatial light modulator 18C, and a Fourier lens 18D, which are arranged in that order from the beam splitter 14. The reference optical system 20 also includes a mirror 20A.

The image pickup optical system 22 is configured to include a focusing lens 22A disposed on the optical axis of the object beam extended through the holographic recording medium 16, and an image pickup device 22B, serving as a two-dimensional photo detector for image detection, disposed at a position where the focusing lens 22A focuses a diffracted beam.

Between the focusing lens 22A and the image pickup device 22B in the image pickup optical system 22, interposed is a second beam splitter 23 which allows a portion of the diffracted beam having passed through the focusing lens 22A to be reflected sideward.

The ON pixel number detector 24 includes a two-dimensional photo detector 24A and an ON pixel number determinator 24B. The reflected beam is allowed to be incident upon the two-dimensional photo detector 24A, and the output signal from the two-dimensional photo detector 24A is allowed to enter the ON pixel number determinator 24B.

A signal indicative of the result of determination made by the ON pixel number determinator 24B enters the threshold setter 26, causing the input signal from the image pickup device 22B to be 1 or 0 based on the threshold that has been set.

The spatial light modulator 18C is controlled by a controller 28 so as to convert digital information to be recorded into a two-dimensional image, and allow the object beam to be subjected to spatial optical modulation based on the information of the two-dimensional image.

As is discussed below, the controller 28 is adapted to convert digital information to be recorded into a two-dimensional image and encode the resulting two-dimensional image.

Figure 2:
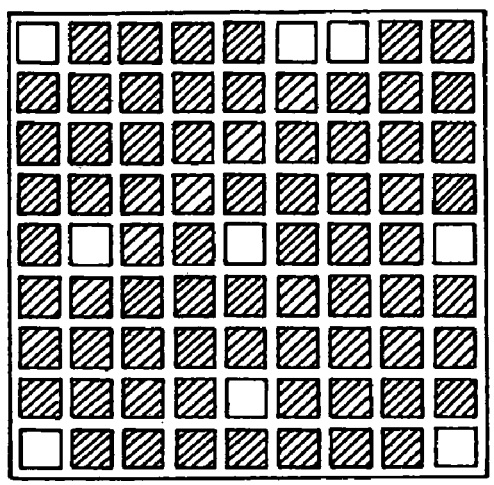
FIG. 2 is a bit map image illustrating the entire image to be encoded in the first embodiment.
Figure 2:
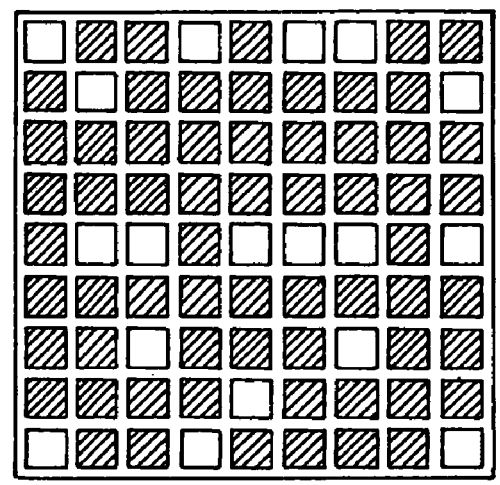
Figure 2:
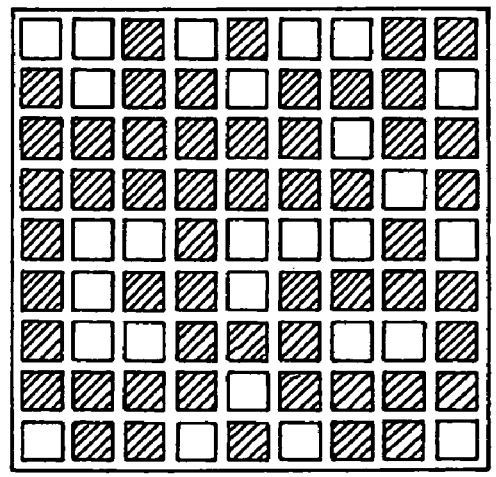

For example, an image to be encoded by the controller 28 is as shown in FIGS. 2(A) to (C), where for simplicity, the image is made up of 9×9 pixels. The controller 28 is also adapted to divide the entire image shown in FIG. 2 into unit pixel blocks each containing 3×3 pixels for display. In FIG. 2, a white pixel and a black pixel indicate an ON pixel and an OFF pixel, respectively.

Figure 3:
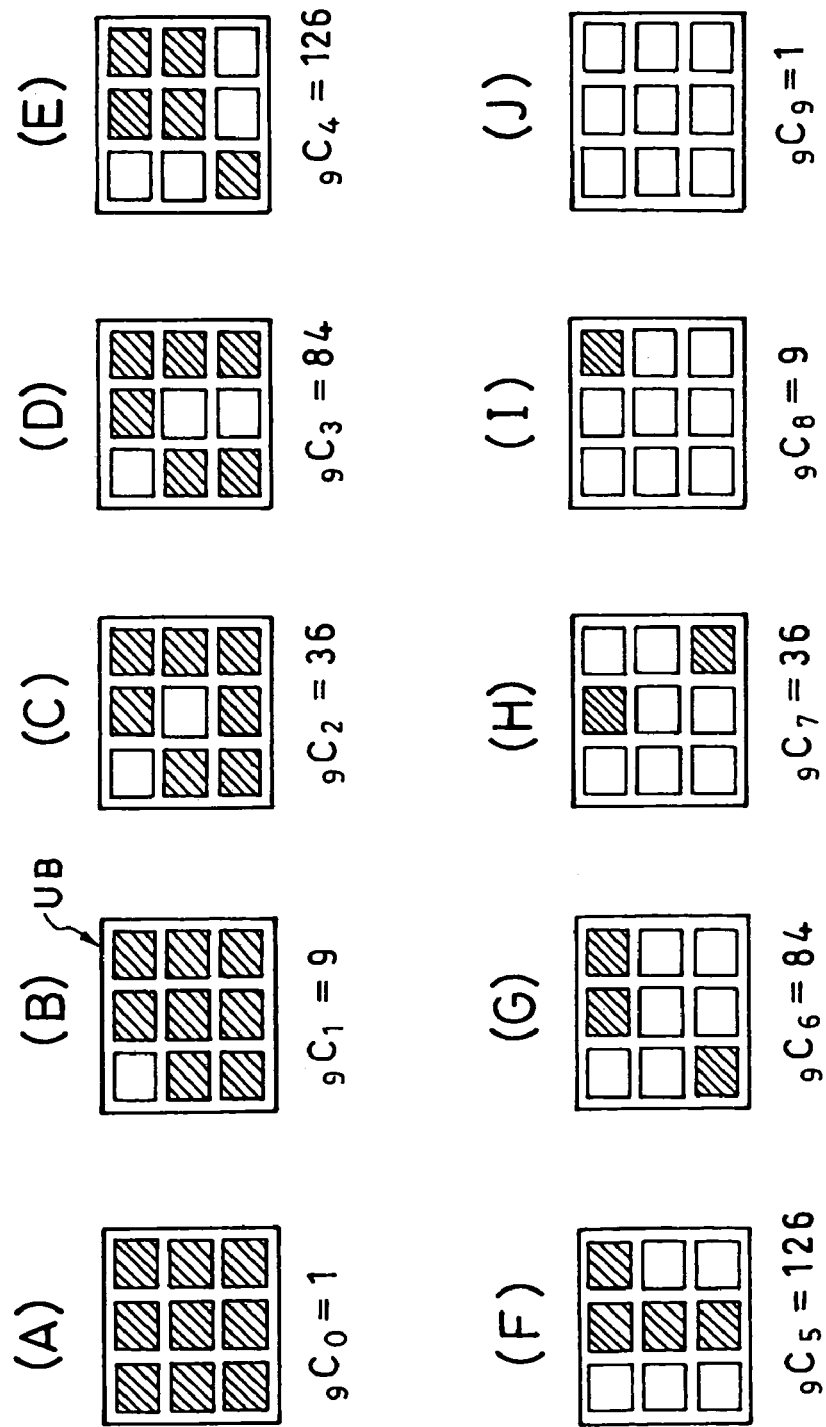
FIG. 3 is a bit map image illustrating an example of a unit pixel block and an encoded pattern that can be displayed by the unit pixel block in the first embodiment.

FIG. 3 shows an example of a unit pixel block UB, where FIG. 3(A) shows a case of the number of ON pixels within a unit pixel block being 0, FIG. 3(B) shows a case of the number being one, . . . , and FIG. 3(J) shows a case of the number being nine.

The controller 28 is designed not to fix the number of ON pixels within each unit pixel block but to take any value from among 0 to 9 pixels.

As respectively indicated at a lower portion of FIGS. 3(A) to (J), this allows the number of patterns that can be represented by one unit pixel block UB to be a total sum of $_9C_0$ to $_9C_9$. In this case, the total number of patterns is thus $512=2_9$, while the coding rate is 9/9=100%.

Note that as described in Description of BACKGROUND ART, since an encoded pattern having a larger number of ON pixels exhibits a higher degree of photosensitivity consumption per bit, it is possible to form the encoded pattern only of a combination of a less number of ON pixels when the system performance is governed by the dynamic range of a recording material.

For example, when zero to four ON pixels (FIGS. 3(A) to (E)) are allowed in the coding as shown in FIG. 3, the number of patterns that can be represented by the unit pixel block UB is 256 with a coding rate of 8/9=89%, still making it possible to have the advantage over the case of the number of ON pixels being fixed.

Now, a description will be given to a process step where digital information is encoded into a two-dimensional image as described above using the spatial light modulator 18C controlled by the controller 28, and then provided to an object beam for recording on the holographic recording medium 16.

A laser beam emitted from the laser light source 12 is split through the beam splitter 14 into a transmitted beam serving as an object beam and a reflected beam serving as a reference beam.

The object beam enters the object optical system 18 and its beam diameter is expanded through the beam expander 18A. Thereafter, the resulting object beam is reflected off the mirror 18B and intensity modulated through the spatial light modulator 18C on a per pixel basis on a two-dimensional image according to the digital information to be recorded, then passing through the Fourier lens 18D to impinge upon the holographic recording medium 16.

On the other hand, the reference beam reflected off the beam splitter 14 is reflected by the mirror 20A to thereby impinge upon the holographic recording medium 16.

On the holographic recording medium 16, interference fringes formed by the incident object and reference beams allow the two-dimensional image information to be recorded as a hologram.

As described above, in the intensity modulation of the object beam, the controller 28 converts digital information to a two-dimensional image, allowing encoded patterns having a different number of ON pixels on per unit pixel block basis, as shown in FIG. 3 above, to be present at the same time.

Now, a description will be given to a process step for reading digital information from a hologram stored as described above.

During reproducing digital information, when only the reference beam is allowed to impinge upon the holographic recording medium 16 with all the pixels of the spatial light modulator 18C being OFF, the holograms stored on the holographic recording medium 16 act as a diffraction grating to reproduce an object beam, having two-dimensional data, as a diffracted beam.

This object beam is collimated by the focusing lens 22A, allowing an image provided by the spatial light modulator 18C to be focused on the image detection surface of the image pickup device 22B.

An image detected by the image pickup device 22B is corrected for pixel mismatches and subjected to its signal value determination on per pixel basis, and thereafter restored and error corrected to be detected as digital data.

The signal value determination on per pixel basis is made based on the threshold that has been set by the threshold setter 26.

The threshold that is set by the threshold setter 26 is determined based on the signal from the ON pixel number detector 24.

Now, a detailed explanation will be given to the configuration and operation of the ON pixel number detector 24.

Figure 4:
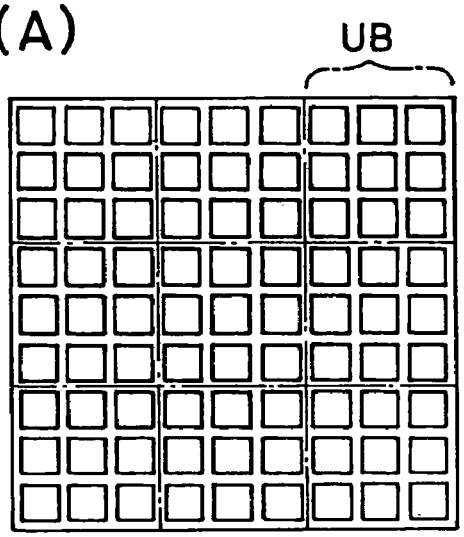
FIG. 4 is a schematic view illustrating the size of pixels in an image pickup device for reproducing digital information in comparison with the size of pixels in a two-dimensional photo detector in the first embodiment.
Figure 4:
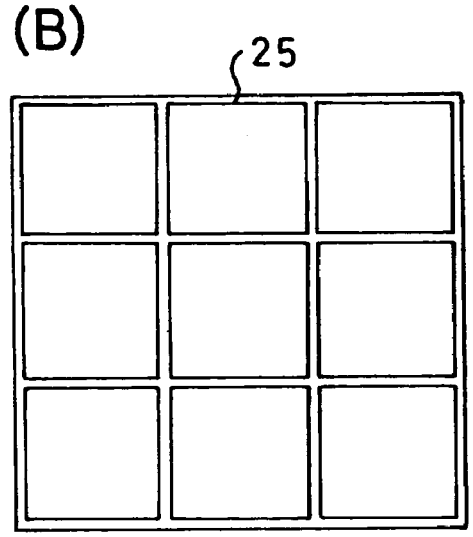

As shown in FIG. 4(B), the size of a pixel 25 of an image detected by the two-dimensional photo detector 24A is nine times the pixel size of the image on the image pickup device 22B as shown in FIG. 4(A), i.e., corresponding to the unit pixel block UB. The two-dimensional photo detector 24A is designed to detect the amount of light at each pixel.

The ON pixel number determinator 24B is designed to determine the number of ON pixels from among 0 to 9 according to the amount of light from the two-dimensional photo detector 24A on per pixel basis (on per unit pixel block UB basis in the spatial light modulator 18C), and then output the result of the determination to the threshold setter 26.

Figure 5:
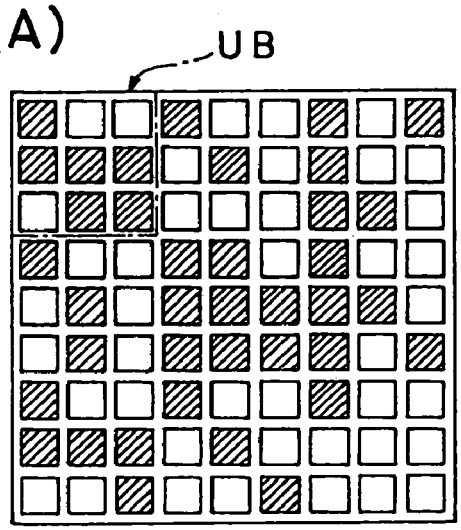
FIG. 5 is a schematic view illustrating the amount of light and the pattern of an image detected by the image pickup device and the two-dimensional photo detector.
Figure 5:
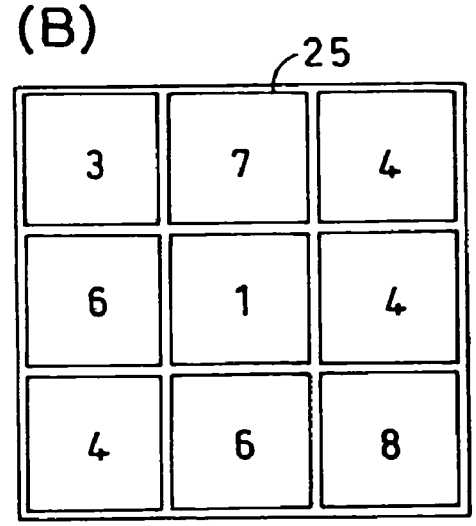

FIG. 5 shows how the detection is actually carried out, FIG. 5(A) illustrating a coded data image and FIG. 5(B) illustrating an image detected by the two-dimensional photo detector 24A. Note that for simplicity in representation, numerical values are used to indicate the amount of detected light at each pixel in FIG. 5(B), and more specifically, a numerical value is used to indicate the number of ON pixels in a unit pixel block that contains nine pixels.

Accordingly, as shown in FIG. 5(B), at a pixel on the two-dimensional photo detector 24A (corresponding to a unit pixel block), e.g., at the upper left unit pixel block containing nine pixels in FIG. 5(A), the number of ON pixels is determined to be 3 from the number 3 shown in FIG. 5(B).

Then, in the image pickup device 22B, the amount of incident light is detected at each of the nine pixels in the unit pixel block having three ON pixels. As will be discussed below, based on the determined number of ON pixels or three, an image processor 30 determines those three pixels having the largest amount of light to be ON and the remaining six pixels to be OFF, thus allowing the original digital information to be reproduced through restration and error correction.

Now, referring to FIGS. 6 and 7, a description will be given to process steps followed in the image processor 30 for ON/OFF pixel determination and reproduction of final digital information based thereon.

Figure 6:
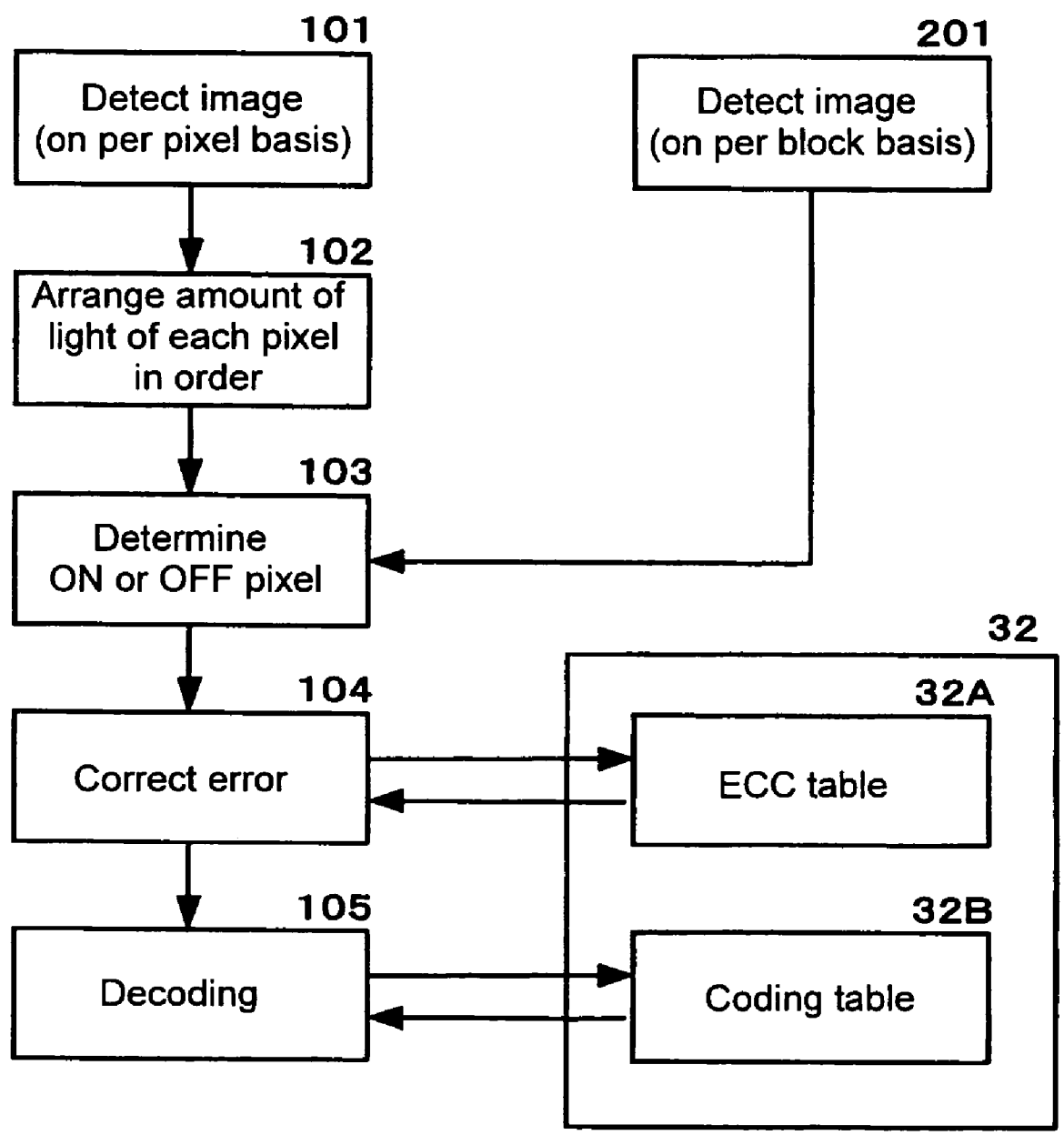
FIG. 6 is a flowchart, including a block diagram, showing process steps for determining the ON/OFF of a pixel to perform image processing in an image processor according to the first embodiment.
Figure 7:
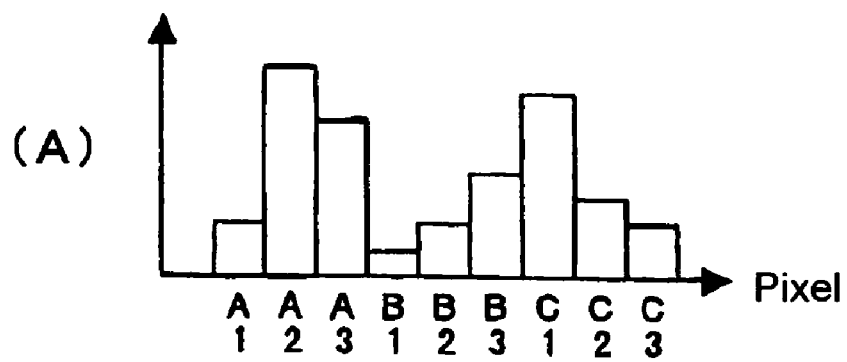
FIG. 7 is a diagram showing a process step for determining an ON/OFF pixel in the image processor.
Figure 7:
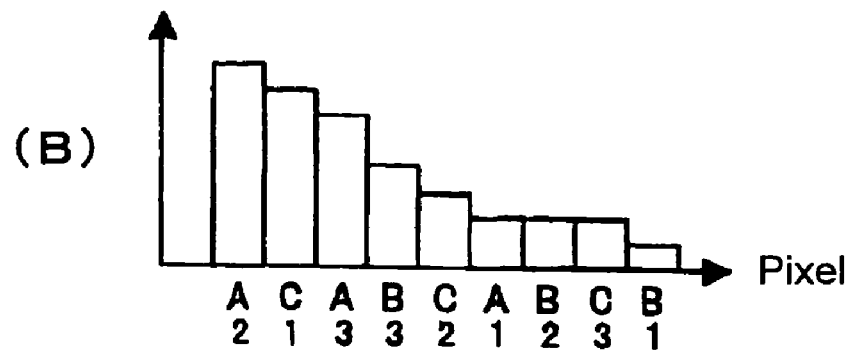
Figure 7:
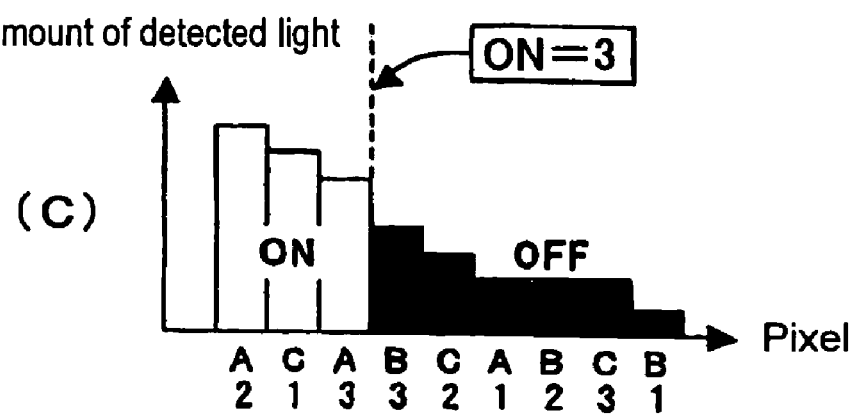

In step 101 of FIG. 6, the image pickup device 22B detects an image on per pixel basis (see FIG. 7(A)).

On the other hand, in step 201, the two-dimensional photo detector 24A detects an image on per unit pixel block basis, and as described above, the ON pixel number detector 24 detects the number of ON pixels on per unit pixel block basis, then delivering a threshold value to the image processor 30 via the threshold setter 26.

In step 102, the image processor 30 arranges the amount of light of each pixel in order as shown in FIG. 7(B), and then proceeds to step 103.

In step 103, based on the threshold signal from the threshold setter 26, it is determined whether the pixels arranged in order are an ON or OFF pixel.

In this case, as shown in FIG. 7(C), those three pixels having a threshold value of 3 and a larger amount of detected light are determined to be an ON pixel.

Then, in step 104, an error correction is carried out with reference to the data in an ECC table 32A that is pre-stored in a ROM 32. Then, in step 105, a restration is carried out with reference to a coding table 32B in the ROM 32 in order to reproduce the original digital information.

Note that as can be seen from the above description, the spatial light modulator 18C and the image pickup device 22B handle bit map images, whereas the two-dimensional photo detector 24A has to detect gray-scale images.

In this context, when the dynamic range falls short in detecting reproduced images by the two-dimensional photo detector 24A, the quality of reproduced images can be conceivably improved by (1) elongating the reproduction time, (2) increasing the optical reproduction power, and (3) reducing the number of ON pixels to be encoded.

For example, when the number of ON pixels to be encoded is reduced as in (3) above, and the numbers of ON pixels, e.g., only 2, 5, and 8, are allowed in FIG. 3, the dynamic range per one level is three times larger in the gray scale of an image detected by the two-dimensional photo detector 24A, thus allowing for improving the accuracy of detecting light. In this manner, a coding rate of 78% can be obtained.

Note that the aforementioned first embodiment is related to the holographic read and write apparatus 10; however, the present invention is not limited thereto. The invention should also be applicable to a holographic recording apparatus which is intended only to record digital information on the holographic recording medium 16, or a holographic memory reproduction apparatus which directs a reference beam to a holographic recording medium 16 having holograms pre-stored in order to reproduce information.

INDUSTRIAL APPLICABILITY

Even when the numbers of ON pixels in unit pixel blocks are different from each other, the present invention makes it possible to detect the number of ON pixels on per pixel block basis and change the threshold of a detected beam intensity between ON and OFF on per pixel block basis in a two-dimensional photo detector, thereby providing the effects of reducing BERs and increasing coding rates.

The invention claimed is:

1. A holographic recording method for converting digital information to a two-dimensional image, allowing an object beam to be subjected to spatial optical modulation based on the two-dimensional image, and irradiating a holographic recording medium with the object beam in conjunction with a reference beam to record the two-dimensional image using interference fringes, wherein with four or more pixels on the two-dimensional image employed as a unit pixel block, encoded patterns having a different number of ON pixels are allowed to be present at the same time in the unit pixel block to record the two-dimensional image.

2. The holographic recording method according to claim 1, wherein when the number of pixels forming the unit pixel block is n, the number of the encoded patterns is a total sum of $_nC_0$ to $_nC_n$.

3. A holographic memory reproduction method for reproducing digital information, the digital information being recorded by converting the digital information to a two-dimensional image, and irradiating a holographic recording medium with an object beam having been subjected to spatial optical modulation based on the two-dimensional image, in conjunction with a reference beam to record the two-dimensional image using interference fringes, wherein the two-dimensional image is recorded, with four or more pixels employed as a unit pixel block and at least two types of encoded patterns having a different number of ON pixels in the unit pixel block being allowed to be present at the same time, when the number of pixels in the unit pixel block is n, the number of types of the encoded patterns provided is equal to a total sum N of $_nC_0$ to $_nC_n$, and n types of settings are provided for the threshold of the detected beam intensity, and during a reproduction operation, the number of ON pixels is detected on the per unit pixel block basis, and a threshold of a detected beam intensity between ON and OFF in a two-dimensional image detector used for image detection is set based on the number of ON pixels detected.

4. A holographic recording apparatus for converting digital information to a two-dimensional image, allowing an object beam to be intensity modulated using a spatial light modulator based on the two-dimensional image, and irradiating a holographic recording medium with the object beam in conjunction with a reference beam to record the two-dimensional image using interference fringes, wherein the spatial light modulator is configured to display a two-dimensional image, with four or more pixels on the two-dimensional image employed as a unit pixel block and with at least two types of encoded patterns having a different number of ON pixels in the unit pixel block being allowed to be present at the same time.

5. The holographic recording apparatus according to claim 4, wherein when the number of pixels in the unit pixel block is n, the spatial light modulator is configured to display encoded patterns of types equal in number to a total sum N of $_nC_0$ to $_nC_n$.

6. A holographic memory reproduction apparatus for reproducing digital information by a two-dimensional photodetector used for image detection, the digital information being recorded by converting the digital information to a two-dimensional image, and irradiating a holographic recording medium with an object beam having been subjected to spatial optical modulation based on the two-dimensional image, in conjunction with a reference beam to record the two-dimensional image using interference fringes, wherein the two-dimensional image is recorded, with four or more pixels employed as a unit pixel block and with at least two types of encoded patterns having a different number of ON pixels in the unit pixel block being allowed to be present at the same time, the holographic memory reproduction apparatus has an ON pixel number detector for detecting the number of ON pixels on the per unit pixel block basis, and a threshold setter for setting a threshold of a detected beam intensity between ON and OFF in the two-dimensional photodetector based on the number of ON pixels detected by the ON pixel number detector, and when the number of pixels in the unit pixel block is n, the number of types of encoded patterns displayed by the spatial light modulator is set to be equal to a total sum N of $_nC_0$ to $_nC_n$, and the threshold setter is allowed to provide n types of settings for the threshold.

* * * * *